United States Patent
Tsao et al.

(10) Patent No.: US 9,465,070 B2
(45) Date of Patent: Oct. 11, 2016

(54) ELECTRONIC DEVICE AND DETECTION METHOD THEREOF

(71) Applicant: Metalligence Technology Corporation, Hsinchu (TW)

(72) Inventors: Shiao-Li Tsao, Taipei (TW); Ming-Ling Lo, New Taipei (TW)

(73) Assignee: METALLIGENCE TECHNOLOGY CORPORATION, Hsinchu (TW)

( * ) Notice: Subject to any disclaimer, the term of this patent is extended or adjusted under 35 U.S.C. 154(b) by 22 days.

(21) Appl. No.: 14/586,990

(22) Filed: Dec. 31, 2014

(65) Prior Publication Data

US 2016/0033568 A1 Feb. 4, 2016

(30) Foreign Application Priority Data

Aug. 1, 2014 (TW) .............................. 103126430 A (51) Int. Cl.
*G06F 1/26* (2006.01)
*G01R 19/06* (2006.01)
*G01R 31/28* (2006.01)
*G01R 19/25* (2006.01)

(52) U.S. Cl.
CPC ....... *G01R 31/2825* (2013.01); *G01R 19/2506* (2013.01)

(58) Field of Classification Search
CPC .. G01R 33/385; G01R 33/543; G01R 21/06; G01R 27/2611; G01R 19/2513; G01R 19/0092; G01R 19/0084; G01R 21/00; G06F 19/00; H02J 3/14; H02J 1/14; Y10T 307/461; H04B 3/546; H04B 3/56; H04B 2203/5433; H04B 2203/5454; H04B 2203/5491

USPC ........ 324/508, 76.11, 510–511, 764.01, 771, 324/322, 500, 654, 649, 600
See application file for complete search history.

(56) References Cited

U.S. PATENT DOCUMENTS

| | | | |
|---|---|---|---|
| 5,717,325 A | 2/1998 | Leeb et al. | |
| 8,487,634 B2* | 7/2013 | Masters | H02J 3/14 324/512 |
| 2011/0213510 A1* | 9/2011 | Mozayeny | A61M 5/1723 700/297 |
| 2014/0002055 A1* | 1/2014 | Costa | G06F 11/3006 324/76.11 |

FOREIGN PATENT DOCUMENTS

| | | |
|---|---|---|
| CN | 101118255 A | 2/2008 |
| CN | 103135009 A | 6/2013 |
| CN | 103973761 A | 8/2014 |
| CN | 103998942 A | 8/2014 |

\* cited by examiner

*Primary Examiner* — Arleen M Vazquez
*Assistant Examiner* — Taqi Nasir
(74) *Attorney, Agent, or Firm* — CKC & Partners Co., Ltd.

(57) ABSTRACT

An electronic device and a detection method thereof for detecting an appliance are provided herein. The detection method includes: selectively providing a first test load to connect with the appliance or providing a first test signal to the appliance; detecting a first voltage/current value of the appliance when the appliance is connected with the first test load or when the appliance receives the first test signal; generating a first voltage/current signature data according to the first voltage/current value; and identifying a type of the appliance according to the first voltage/current signature data.

10 Claims, 5 Drawing Sheets

ELECTRONIC DEVICE AND DETECTION METHOD THEREOF

RELATED APPLICATIONS

This application claims priority to Taiwan Application Serial Number 103126430 filed Aug. 1, 2014, which is herein incorporated by reference.

BACKGROUND

1. Technical Field

The present disclosure relates to an electronic device. More particularly, the present disclosure relates to an electronic device for detecting a type of an appliance.

2. Description of Related Art

Nonintrusive load monitoring system (NILMS) is configured to monitor power consumption of each load of NILMS only by installing a set of voltage/current measuring device on a power entrance and analyzing a measured voltage/current signal on the power entrance through some algorithms. Therefore, it is unnecessary to install a sensor and a measure device on each load of NILMS. Accordingly, NILMS provides a convenient, effective and low-cost method to monitor the appliance.

Conventional NILMS determines states of an appliance only according to the voltage and current of a power loop. However, the voltage and current consumption of an appliance are also related to the present supply voltage and current. In other words, the power consumption of an appliance may change if we adjust the voltage and current supplied to the appliance. Moreover, since most current electronic devices contain IC or the switch power supply which result in electromagnetic interference, an accuracy of monitoring appliance may be affected by the interference arose from high frequency signal.

SUMMARY

In order to solve aforementioned problems, the present disclosure is to provide an electronic device and a detection method thereof so as to enhance accuracy and efficiency of appliance detection.

One aspect of the present disclosure is to provide a detection method for detecting an appliance. The detection method includes: selectively providing a first test load to connect with the appliance or providing a first test signal to the appliance; detecting a first voltage/current value of the appliance when the appliance is connected with the first test load or when the appliance receives the first test signal; generating a first voltage/current signature data according to the first voltage/current value; and identifying a type of the appliance according to the first voltage/current signature data.

According to one embodiment of the present disclosure, the step of identifying the type of the appliance according to the first voltage/current signature data includes: comparing the first voltage/current signature data with several signature data so as to generate a comparison result data; and identifying the type of the appliance according to the comparison result data.

According to one embodiment of the present disclosure, when the type of the appliance is unable to be identified according to the first voltage/current signature data, the detection method further includes: selectively providing a second test load to connect with the appliance or providing a second test signal to the appliance; generating a second voltage/current signature data according to a second voltage/current value of the appliance when the appliance is connected with the second test load or when the appliance receives the second test signal; and identifying the type of the appliance according to the second voltage/current signature data.

According to one embodiment of the present disclosure, before the step of generating the first voltage/current signature data according to the first voltage/current value, the detection method further includes: comparing the first voltage/current value with a threshold value; and generating the first voltage/current signature data when the first voltage/current value conforms to the threshold value.

Another aspect of the present disclosure is to provide an electronic device configured to detect a type of an appliance. The electronic device includes a programmable load and signal module and a processing module. The programmable load and signal module is electrically connected with the appliance. The programmable load and signal module includes several loads, a test load generating unit and a test signal generating unit respectively. The loads and the test load generating unit are configured to provide several test loads or to choose a test load from several test loads. The test signal generating unit is configured to generate several test signals. The processing module is configured to selectively connect one of the test loads with the appliance, or provide one of the test signals to the appliance. The processing module is also configured to identify a type of the appliance according to a voltage/current signature data of the appliance when the appliance is connected with the one of the test loads or when the appliance receives the one of the test signals.

According to one embodiment of the present disclosure, the electronic device further includes a voltage/current detecting module electrically connected with the programmable load and signal module and the processing module. The voltage/current detecting module is configured to detect a voltage/current value of the appliance when the appliance is connected with the test load or when the appliance receives the test signal. The processing module generates the voltage/current signature data according to the voltage/current value According to one embodiment of the present disclosure, the processing module includes a signature detecting unit, a signature extracting unit and a control unit. The signature detecting unit is configured to generate the voltage/current signature data according to the voltage/current value. The signature extracting unit is configured to compare the voltage/current signature data with several signature data so as to generate a comparison result data. The control unit is configured to identify the type of the appliance according to the comparison result data.

According to one embodiment of the present disclosure, the processing module further includes a test management unit. The test management unit is configured to search one of several test load data or one of several test signal data in a test database according to the comparison result data. The test management is configured to provide the searched load data or the searched test signal data to the programmable load and signal module. The programmable load provides the corresponding test load to connect with the appliance according to the test load data provided by the test management unit or the signal module provides the corresponding test signal to the appliance according to the test signal data provided by the test management unit.

According to one embodiment of the present disclosure, the electronic device further includes a signature database.

The signature database is configured to store the signature data of different types of appliances corresponding to the different test loads and the different test signals.

According to one embodiment of the present disclosure, the signature detecting unit is further configured to compare the voltage/current value with a threshold value. The signature detecting unit generates the voltage/current signature data according to the voltage/current value when the voltage/current value matches the threshold value.

According to one embodiment of the present disclosure, the test loads of the test load generating unit include several RLC (resistor-inductor-capacitor) loads, a variable RLC load, a transformer, a filter and a regulator.

According to one embodiment of the present disclosure, the test signals include a harmonic, a power line communication signal and an infrared signal.

As mentioned above, by selectively providing the test load to connect with the appliance or providing the test signal to the appliance, and by comparing the present voltage/current signature data of the appliance with the signature data, the load states of the appliance can be determined quickly and precisely, such that the type of the appliance can be identified. Accordingly, accuracy and efficiency of appliance detection can be improved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follow.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

Figure 1:
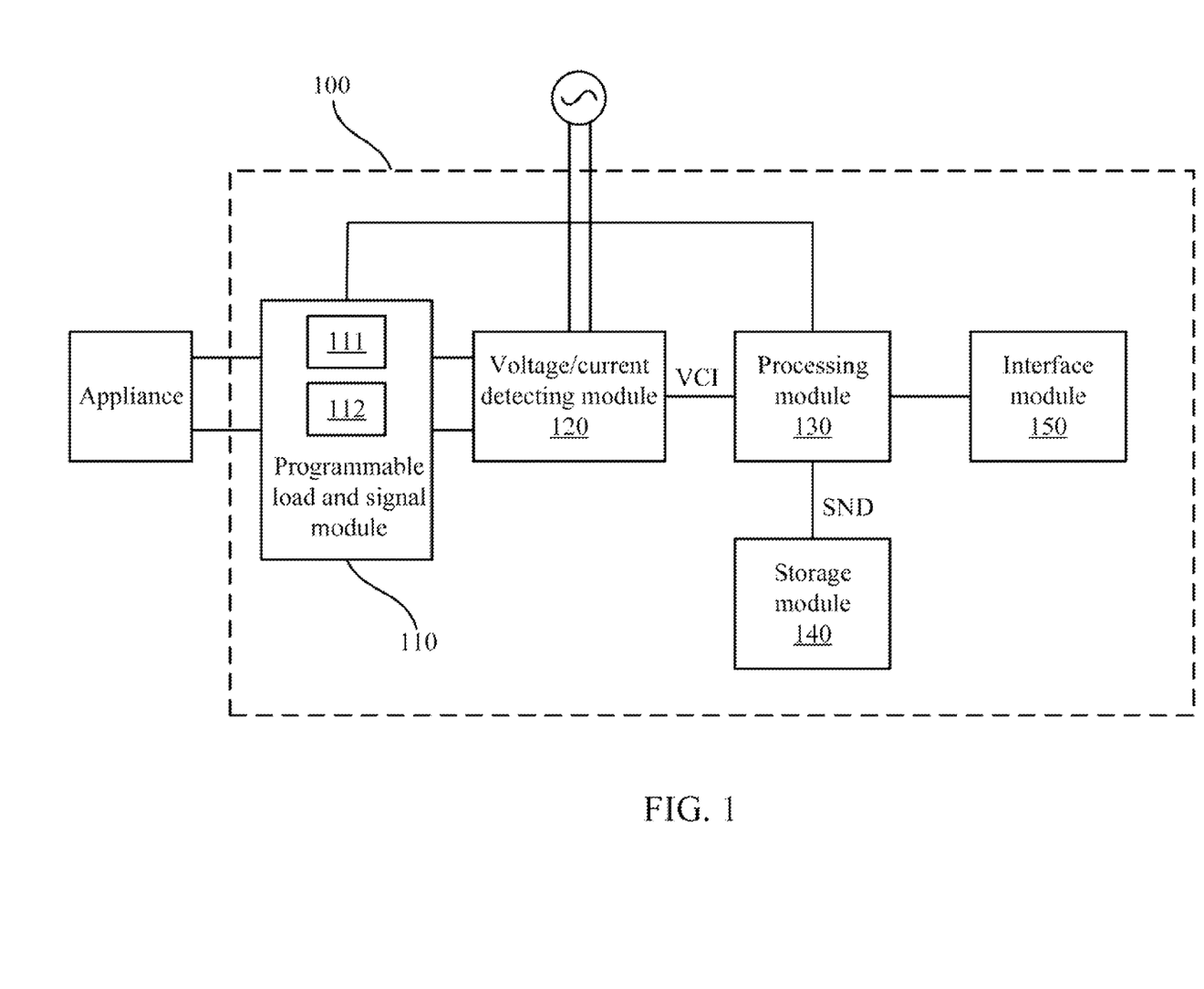
FIG. 1 depicts a block diagram of an electronic device according to one embodiment of the present disclosure.

Reference is made to FIG. 1. FIG. 1 depicts a block diagram of an electronic device 100 according to one embodiment of the present disclosure. When the electronic device 100 is connected with an appliance, the user can detect states of the appliance and identify a type of the appliance by the electronic device 100. In one embodiment, the electronic device 100 is realized in a form of a power meter or in a form of power socket. If the electronic device 100 is realized in a form of a power meter, the user may connect the electronic device 100 with the appliance through an electrical wire or a probe so as to detect states of the appliance. If the electronic device 100 is realized in a form of a power socket, the user may connect a plug of the appliance with a socket of the electronic device 100 so as to detect states of the appliance. It is noted that the aforementioned embodiments are merely for purposes of exemplary illustration and are not intended to limit the present disclosure. It will be apparent to those skilled in the art that different modifications and variations can be made to the structure of the present disclosure without departing from the scope or spirit of the disclosure.

The electronic device 100 includes a programmable load and signal module 110, a voltage/current detecting module 120, a processing module 130, a storage module 140 and an interface module 150. The programmable load and signal module 110 is configured to connect with the appliance, and includes at least one test load generating unit 111 and/or a test signal generating unit 112 respectively. In order to illustrate the electronic device 100 clearly, FIG. 1 depicts one test load generating unit 111, but the present embodiment is not limited in this regard. The test load generating unit 111 is configured to generate several test loads for connecting with the appliance, so as to change load characteristic of an electrical circuit loop connected with the appliance. The test signal generating unit 112 is configured to generate at least one test signal to the appliance. The voltage/current detecting module 120 receives the external power source (e.g., AC power from the power company), and provides the external power to the appliance through the programmable load and signal module 110. The voltage/current detecting module 120 can further detect a voltage/current value VCI of the appliance when the appliance is connected with the test load or when the appliance receives the test signal.

The processing module 130 is configured to generate a voltage/current signature data according to the voltage/current value VCI of the appliance, and to identify a type of the appliance according to the voltage/current signature data when the appliance is connected with the test load or when the appliance receives the test signal. The voltage/current signature data are response states of the appliance (e.g., a voltage variation, a current variation, or a phase relation between a voltage and a current) when the appliance is connected with the test load or when the appliance receives the test signal. In one embodiment, the electronic device 100 further includes an analog-to-digital converter (not shown in the figure). The analog-to-digital converter is configured to convert analog data (e.g., the voltage/current value detected by the voltage/current detecting module 120) into digital data, and to provide the digital data to the processing module 130. The processing module 130 can generate the voltage/current signature data according to the digital data, but the present embodiment is not limited in this regard.

In one embodiment, the processing module 130 is configured to compare the voltage/current signature data with several signature data SND stored in the storage module 140 so as to analyze and identify the type of the appliance. The signature data SND are response characteristics of different appliances when they are connected with each test load and when they receive each test signal. For example, the signature data SND may be a relation between the voltage phase and the current phase. Specifically, the appliance can be viewed as a load. Different types of appliances have different phase relations corresponding to their load state (e.g., the resistive load, the capacitive load, the inductive load, etc.). For example, the voltage phase leads the current phase, the current phase leads the voltage phase, the difference between the voltage phase and the current phase, and so on. Therefore, by connecting a load with the appliance or providing a signal to the appliance, and by comparing the voltage phase response with the current phase of the appliance, the load states of the appliance can be determined so as to identify the type of the appliance. After the processing module 130 identifies the type of the appliance, the electronic device 100 can output the type and states of the appliance to the user by the interface module 150.

In one operation, the processing module 130 can select one test load to connect with the appliance, in which the test load is generated by the test load generating unit 111 of the programmable load and signal module 110, and the voltage/current value VCI of the appliance can de detected by the voltage/current detecting module 120 when the appliance is connected with the test load. The processing module 130 can generate the voltage/current signature data according to the voltage/current value VCI, for example, detecting a voltage phase or a current phase so as to generate the corresponding voltage/current signature data, but the present disclosure is not limited in this regard. Then, the processing module 130 can identify the type of the appliance according to the voltage/current signature data of the appliance. In another operation, the processing module 130 can provide one test signal to the appliance, in which the test signal is generated by the test signal generating unit 112 of the programmable load and signal module 110, and the voltage/current value VCI of the appliance can de detected by the voltage/current detecting module 120 when the appliance receives the test signal. Similarly, the processing module 130 can generate the voltage/current signature data according to the voltage/current value VCI, and identifies the type of the appliance according to the voltage/current signature data of the appliance.

For example, if the voltage/current signature data is that the voltage phase leads the current phase, the processing module 130 can determine that the load state of the appliance is inductive. Therefore, the processing module 130 can exclude the appliances in which the load states of the appliances are resistive and capacitive. If the type of the appliance is unable to be identified in the first test, the processing module 130 can execute another test on the appliance (e.g., providing another test load to connect with the appliance or providing another test signal to the appliance), and obtain other voltage/current signature data (e.g., a ratio of the voltage to the current, resonant frequency, etc.) so to further identify the type of the appliance.

Figure 2A:
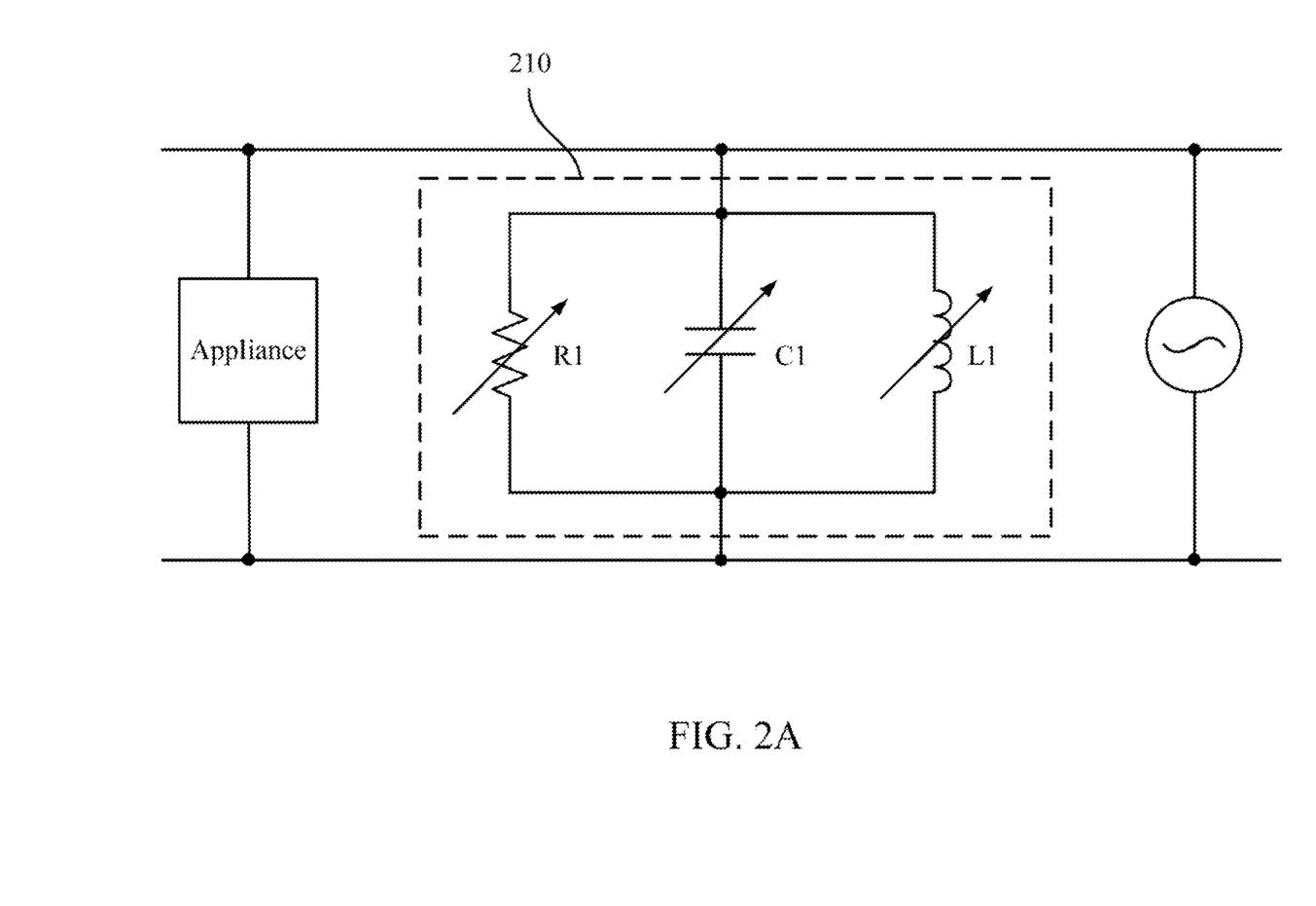
FIG. 2A depicts a schematic diagram of a test load according to one embodiment of the present disclosure.

In one embodiment, the test loads generated by the test load generating unit 111 include several RLC (resistor-inductor-capacitor) loads, a variable RLC load, a transformer, a filter, a regulator, etc. Reference is made to FIG. 2A. FIG. 2A depicts a schematic diagram of a test load 210 according to one embodiment of the present disclosure. The test load 210 can be applied in the electronic device 100 of FIG. 1, but the present disclosure is not limited in this regard. In the present embodiment, the test load 210 includes a variable resistor R1, a variable capacitor C1 and a variable inductor L1. The variable resistor R1, the variable capacitor C1 and the variable inductor L1 are connected in parallel to form the RLC load. The RLC load can be realized by a programmable control method, but the present disclosure is not limited in this regard.

Figure 2B:
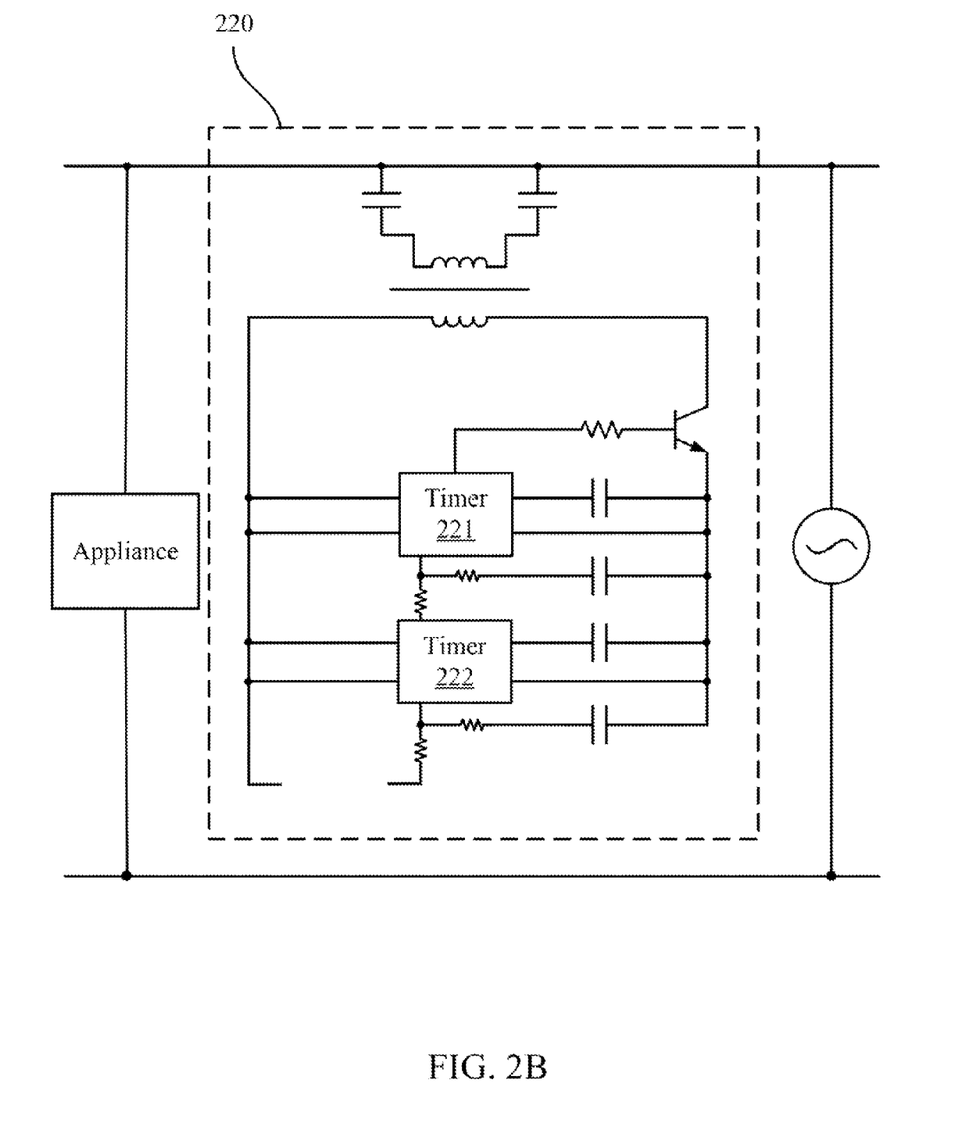
FIG. 2B depicts a schematic diagram of a test signal generating unit according to one embodiment of the present disclosure.

Reference is made to FIG. 2B. FIG. 2B depicts a schematic diagram of a test signal generating unit 220 according to one embodiment of the present disclosure. The test signal generating unit 220 may be applied in the electronic device 100 of FIG. 1, but the present disclosure is not limited in this regard. The test signal generating unit 220 includes a pulse generator which consists of a timer 221 and a timer 222 (e.g., an oscillator, NE555 IC, etc.). In one embodiment, the test signals include a harmonic, a power line communication signal, an infrared signal, etc. For example, if the appliance under test conforms to the power line specification, the electronic device 100 can directly identify the type of the appliance by transmitting-receiving the power line communication signal. Moreover, if the appliance under test conforms to the infrared signal communication specification, the electronic device 100 can directly identify the type of the appliance by transmitting-receiving the infrared communication signal. The aforementioned test signals are merely for purposes of exemplary illustration and are not intended to limit the present disclosure.

Figure 3:
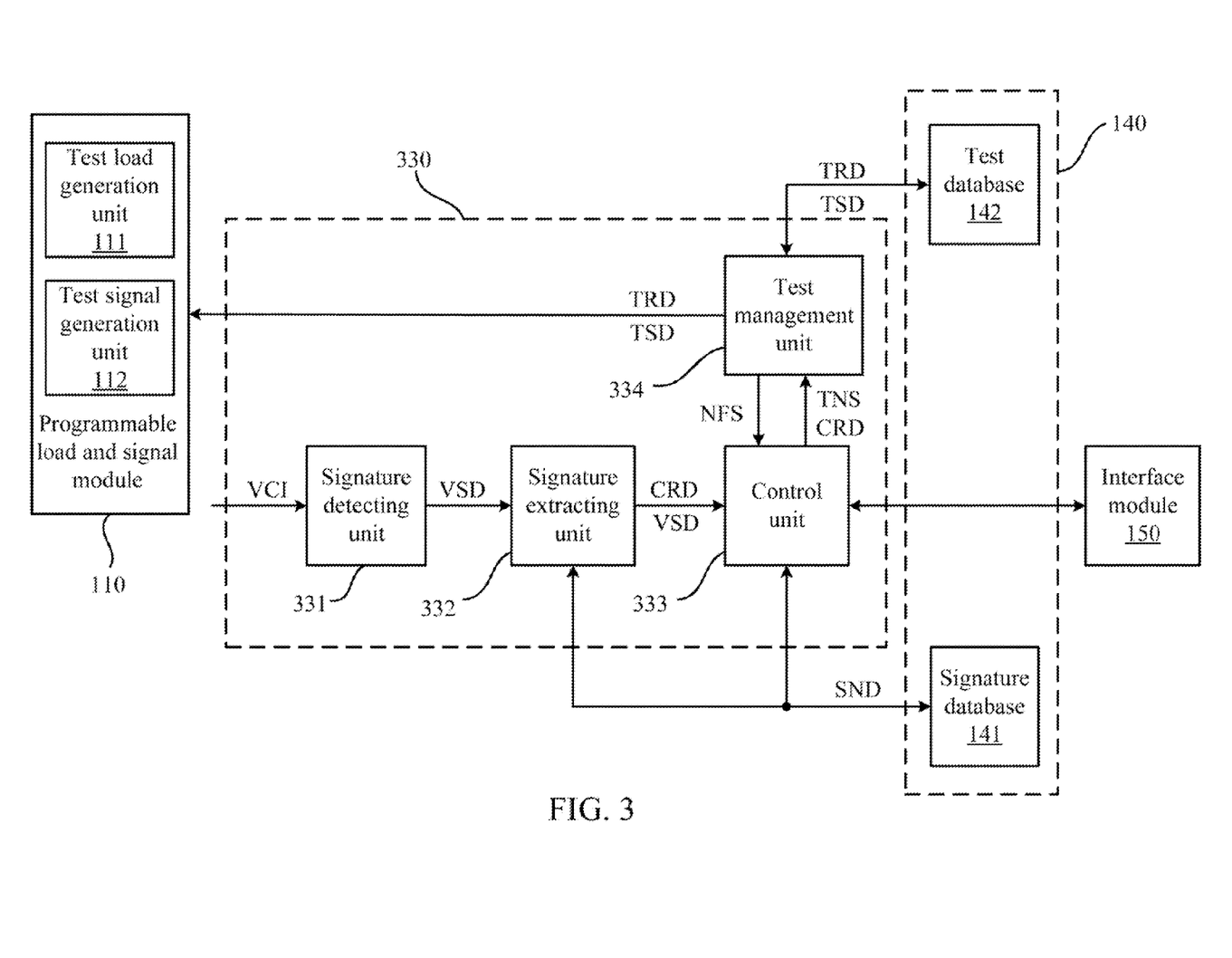
FIG. 3 depicts a block diagram of a processing module according to one embodiment of the present disclosure.

Reference is made to FIG. 1 and FIG. 3. FIG. 3 depicts a block diagram of a processing module 330 according to one embodiment of the present disclosure. The processing module 330 may be applied in the electronic device 100 of FIG. 1, but the present disclosure is not limited in this regard. The processing module 330 includes a signature detecting unit 331, a signature extracting unit 332, a control unit 333 and a test management unit 334. In the present embodiment, the storage module 140 further includes a signature database 141 and a test database 142. The signature database 141 includes several signature data SND. The signature data SND includes several voltage/current signatures of different types of appliances when the different types of appliances are connected with different test loads generated by the test load generating unit 111 or when the different types of appliances receive different test signals generated by the test signal generating unit 112. In other words, the signature database 141 includes several response state data of different types of appliances correspond to different test loads or test signals. The test database 142 includes several test load data and test signal data. In brief, the test database 142 includes several loads and signals for providing to different types of appliances.

The signature detecting unit 331 is electrically connected with the voltage/current detecting module (not shown in the figure), and is configured to generate the voltage/current signature data VSD according to the voltage/current value VCI. The voltage/current signature data VSD is a response characteristic of the appliance when the appliance is connected with the test load or when the appliance receives the test signal. For example, the voltage/current signature data VSD may be a voltage/current phase variation signature of the appliance when the appliance is connected with the test load or when the appliance receives the test signal. Moreover, the voltage/current signature data VSD may be a signature of a various ratio of the voltage to the current of the appliance when the appliance is connected with the test load or when the appliance receives the test signal. The aforementioned voltage/current signature data are merely for purposes of exemplary illustration and are not intended to limit the present disclosure.

In one embodiment, the signature detecting unit 331 further compares the voltage/current value VCI with a threshold value in advance so as to determine whether to generate the voltage/current signature data VSD according to the voltage/current value VCI. Specifically, the voltage/current value VCI detected by the voltage/current detecting module (not shown in the figure) may be invalid or a noise. Therefore, the signature detecting unit 331 can compare the voltage/current value VCI with the threshold value in advance so as to determine whether the voltage/current value VCI is valid. When the voltage/current value VCI conforms to the threshold value, the signature detecting unit 331 determines that the voltage/current value VCI is valid. At this time, the signature detecting unit 331 generates the voltage/current signature data VSD according to the voltage/ current value VCI. When the voltage/current value VCI does not conform to the threshold value, the signature detecting unit 331 determines that the voltage/current value VCI is invalid. At this time, the signature detecting unit 331 does not generate the voltage/current signature data VSD, and wait a next voltage/current value VCI provided from the voltage/current detecting module. The condition that the voltage/current value conforms to the threshold value may be the voltage/current value larger than, equal to or smaller than the threshold value, but the present disclosure is not limited in this regard.

The signature extracting unit 332 is configured to compare the voltage/current signature data VSD with the signature data SND stored in the signature database 141 so as to generate a comparison result data CRD to the control unit 333. Accordingly, the control unit 333 can determine whether the present response state of the appliance is enough to identify the type of the appliance according to the comparison result data CRD, and can further determine whether to provide different test load generated by the test load generating unit 111 or to provide different test signal generated by the test signal generating unit 112 to the appliance, that is, another test is executed on the appliance.

In one embodiment, when the type of the appliance is able to be identified according to the comparison result data CRD, the control unit 333 stops executing test on the appliance. At this time, the control unit 333 can provide the type of the appliance, the voltage/current signature data VSD and the comparison result data CRD to the user by the interface module 150.

When the type of the appliance is unable to be identified according to the comparison result data CRD, the control unit 333 generates a test enable signal TNS, and provides the comparison result data CRD and the test enable signal INS to the test management unit 334. The test management unit 334 is activated by the test enable signal TNS, and then the test management unit 334 searches a suitable test load data TRD or a suitable test signal data TSD in the test database 142 according to the comparison result data CRD for executing another test on the appliance so as to further identify the type of the appliance.

When the test management unit 334 is unable to find the suitable test load data TRD or the suitable test signal data TSD for executing another test on the appliance, the test management unit 142 generates a notification signal NFS to the control unit 333. The control unit 333 can realize that the type of the appliance is unable to be identified because of no suitable test data according to the notification signal NFS. At this time, the control unit 333 can provide the voltage/current signature data VSD, the comparison result data CRD and an identification failure to the user by the interface module 150.

When the test management unit 334 is able to find the suitable test load data TRD or the suitable test signal data TSD for executing another test on the appliance, the test management unit 334 transmits the test load data TRD or the test signal data TSD to the programmable load and signal module 110. The programmable load and signal module 110 can provide the test load corresponding to the test load data TRD to connect with the appliance or provide the test signal corresponding to the test signal data TSD to the appliance. Next, the aforementioned operations are repeated until the type of the appliance can be identified by the control unit 333.

In one embodiment, before a test is executed on the appliance, the user can utilize the interface module 150 and the control unit 333 to update the signature database 141 and the test database 142 by connecting with an outer resource (e.g., a sever or a cloud system) in a wired way or a wireless way, so as to ensure that the signature database 141 and the test database 142 have complete and correct data. The interface module 150 includes wire/wireless ports, USB, RS-232, and son on, but the present disclosure is not limited in this regard.

Figure 4:
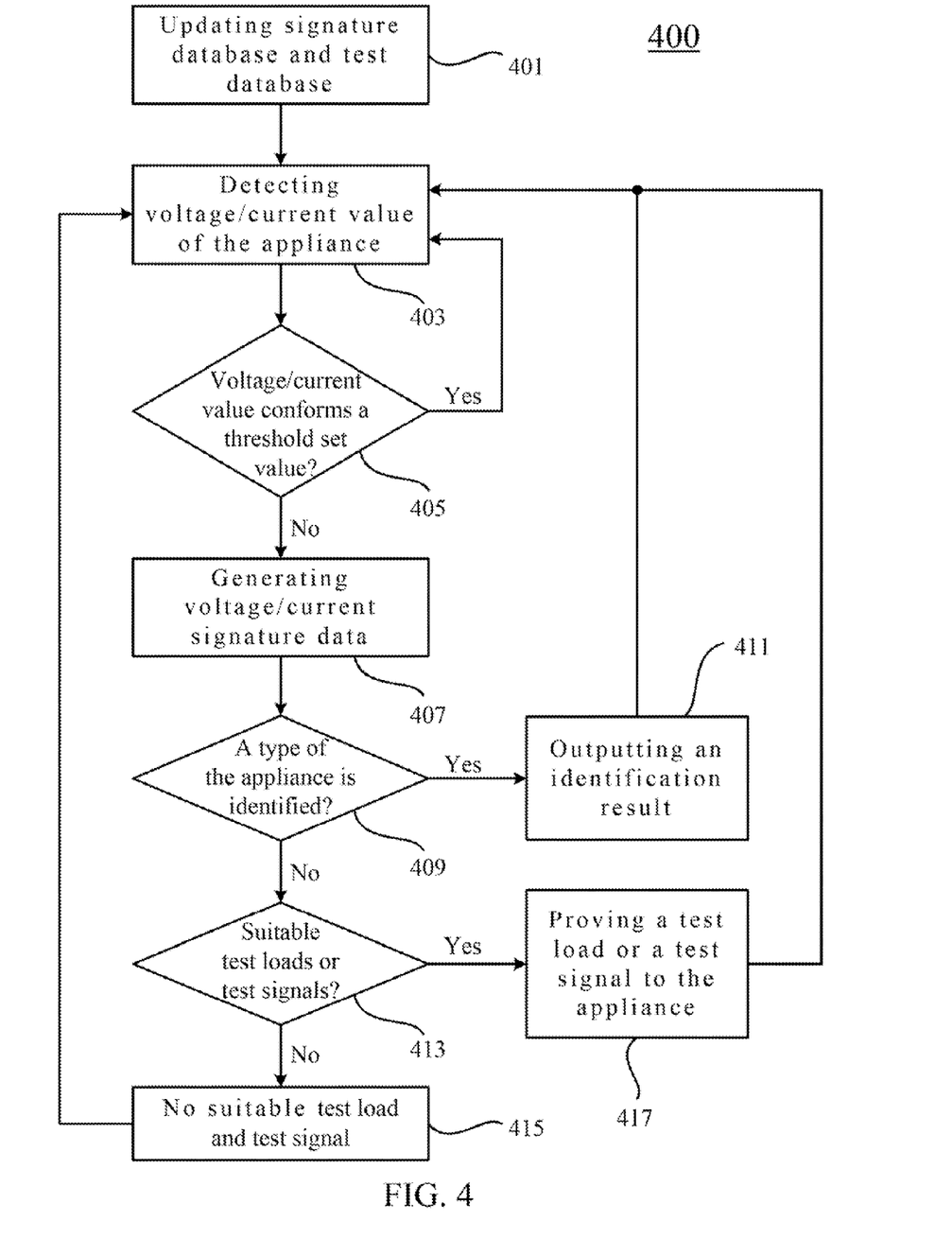
FIG. 4 depicts a flowchart of a detection method according to one embodiment of the present disclosure.

Reference is made to FIG. 4. FIG. 4 depicts a flowchart of a detection method 400 according to one embodiment of the present disclosure. The detection method 400 is configured to detect a type of an appliance. In order to illustrate the detection method 400 clearly, the detection method 400 is illustrated with the electronic device 100 of FIG. 1 and the processing module 330 and the storage module 140 of FIG. 3, but the present disclosure is not limited in this regard.

In operation S401, the signature database 141 and the test database 142 are updated by connecting with an outer resource (e.g., a sever or a cloud system) in a wired way or a wireless way through the interface module 150 and the control unit 333. In operation S403, power is provided to the appliance by the voltage/current detecting module 120 through the programmable load and signal module 110, and the voltage/current value VCI of the appliance is detected by the voltage/current detecting module 120.

In operation S405, a determination is made by the signature detecting unit 331 as to whether the voltage/current value VCI of the appliance conforms to the threshold value, that is, a determination is made as to whether the voltage/current value VCI is valid. When the voltage/current value VCI does not conform to the threshold value, the signature detecting unit 331 determines that the voltage/current value VCI is invalid. Next, operation S403 is executed, that is, the signature detecting unit 331 waits a next voltage/current value VCI provided from the voltage/current detecting module 120. When the voltage/current value VCI conforms to the threshold value, the signature detecting unit 331 determines that the voltage/current value VCI is valid. Next, operation S407 is executed. In operation S407, the voltage/current signature data VSD is generated by the signature detecting unit 331 according to the voltage/current value VCI.

In operation S409, the voltage/current signature data VSD is compared with the signature data SND in the signature database 141 by the signature extracting unit 332 so as to generate the comparison result data CRD. Then, the signature extracting unit 332 transmits the comparison result data CRD and the voltage/current signature data VSD to the control unit 333 so as to identify the type of the appliance. When the type of the appliance is able to be identified by the control unit 333 according to the comparison result data CRD, operation S411 is executed. In operation S411 an identification result is outputted by the interface module 150. In other words, the type of the appliance, the comparison result data CRD and the voltage/current signature data VSD are provided to the user by the interface module 150. Next, operation S403 is executed.

When the type of the appliance is unable to be identified by the control unit 333 according to the comparison result data CRD, operation S413 is executed. In operation S413, the test enable signal TNS is generated by the control unit 333 and the test enable signal TNS is provided to the test management unit 334. The test management unit 334 searches a suitable test load data TRD or a suitable test signal TSD in the test database 142 according to the comparison result data CRD, in which the suitable test load data TRD or the suitable test signal TSD is configured for executing another test on the appliance.

When the test management unit 334 is unable to find the suitable test load data TRD or the suitable test signal data TSD for executing another test on the appliance, operation S415 is executed. In operation S415, the notification signal NFS is generated by the test management unit 334 and the notification signal NFS is provided to the control unit 333. The control unit 333 provides the voltage/current signature data VSD, the comparison result data CRD and an identification failure to the user through the interface module 150 according to the notification signal NFS.

When the test management unit 334 is able to find the suitable test load data TRD or the suitable test signal data TSD for executing another test on the appliance, operation S417 is executed. In operation S417, the test load data TRD or the test signal data TSD are transmitted to the programmable load and signal module 110 by the test management unit 334. The programmable load and signal module 110 provides the test load corresponding to the test load data TRD to connect with the appliance or provides the test signal corresponding to the test signal data TSD. Next, operations S403-S413 are repeated until the type of the appliance is identified.

In one embodiment, the voltage/current signature data VSD may be unable to completely correspond to or conform to any signature data SND in the signature data 141. Accordingly, the present disclosure further discloses that a weight static and analysis is executed for the voltage/current signature data of the appliance when the appliance is connected with different test load or when the appliance receives different test signal. Specifically, in each test on the appliance, the weight value of the test load or the test signal is different. Each weight value is determined according to an experimental analysis. Next, several tests are executed on the appliance, and a sum of each test result which is multiplied by a corresponding weight value is calculated. Next, the sum of each test result multiplied by a corresponding weight value is divided by the number of tests so as to obtain an average value. Accordingly, the type of the appliance can be identified by determining the average value conforms to which states of the appliance.

For example, if the voltage value and the current value of AC power received by an appliance are $V(t)=V_{peak}\sin(\omega_0 t+\delta_1)$ and $I(t)=I_{peak}\sin(\omega_0 t+\theta_1)$, respectively. Moreover, if it is assumed that the voltage/current signature data of the appliance at this time is $F_1^{j,k}(x), F_2^{j,k}(x), \ldots, F_n^{j,k}(x)$. When a test load is connected with the appliance or a test signal is provided to the appliance, the voltage value of the appliance is $V_i(t)=V_i^t\sin(\omega_i^1 t+\delta_i^1)+V_i^2\sin(\omega_i^2 t+\delta_i^2)+\ldots$, and the current value of the appliance is $I_i(t)=I_i^1\sin(\omega_i^1 t+\theta_i^1)+I_i^2\sin(\omega_i^2 t+\theta_i^2)+\ldots$. The voltage/current signature data of the appliance is $F_1^{j,k,i}(x), F_2^{j,k,i}(x), \ldots, F_n^{j,k,i}(x)$ when the appliance is connected with the test load or receives the test signal, in which j represents types of the appliance, k represents signatures, and i presents test loads or test signals. The processing module can collect K signatures corresponding to J types of an appliance when I test loads and test signals are provided to the appliance. Next, a weight distribution is executed for the $k_{th}$ signature that the $j_{th}$ type of the appliance responses when the appliance is connected with the $i_{th}$ test load or when the appliance receives the $i_{th}$ test signal by a formula:

$$\text{MAX}\left[\sum_{p=1}^{I}\prod_{q=1}^{n}\omega_q\cdot F_q^{j,k,p}(S_q^{i,k,p})\right].$$

Next, the weight distribution result is compared with the signature data to find a closer result, so as to identify a most possible type of the appliance.

As mentioned above, the electronic device 100 and the detection method 400 may be implemented in terms of software, hardware and/or firmware. For instance, if the execution speed and accuracy have priority, then the detection method 400 may be implemented in terms of hardware and/or firmware. If the design flexibility has higher priority, then the detection method 400 may be implemented in terms of software. Furthermore, the detection method 400 may be implemented in terms of software, hardware and firmware in the same time. It is noted that the foregoing examples or alternates should be treated equally, and the present disclosure is not limited to these examples or alternates. Anyone who is skilled in the prior art can make modification to these examples or alternates in flexible way if necessary.

As mentioned above, by selectively providing the test load to connect with the appliance or providing the test signal to the appliance, and by comparing the present voltage/current signature data of the appliance with the signature data, the load states of the appliance can be determined quickly and precisely, such that the type of the appliance can be identified. Accordingly, accuracy and efficiency of appliance detection can be improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that different modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A detection method for detecting an appliance, comprising:
    selectively providing a first test load to connect with the appliance or providing a first test signal to the appliance;
    detecting a first voltage/current value of the appliance when the appliance is connected with the first test load or when the appliance receives the first test signal;
    generating a first voltage/current signature data according to the first voltage/current value;
    comparing the first voltage/current signature data with a plurality of signature data so as to generate a comparison result data;
    identifying a type of the appliance according to the comparison result data;
    selectively providing a second test load to connect with the appliance or providing a second test signal to the appliance when the type of the appliance is unable to be identified according to the first voltage/current signature data;
    generating a second voltage/current signature data according to a second voltage/current value of the appliance when the appliance is connected with the second test load or when the appliance receives the second test signal; and
    identifying the type of the appliance according to the second voltage/current signature data.

2. The detection method of claim 1, wherein before generating the first voltage/current signature data according to the first voltage/current value comprises:
  comparing the first voltage/current value with a threshold value; and
  generating the first voltage/current signature data when the first voltage/current value conforms to the threshold value.

3. An electronic device configured to detect an appliance, comprising:
  a programmable load and signal module electrically connected with the appliance, comprising:
  a plurality of loads or a test load generating unit configured to provide a plurality of test loads; and
  a test signal generating unit configured to generate a plurality of test signals; and
  a processing module configured to selectively connect one of the test loads with the appliance, or provide one of the test signals to the appliance, and configured to identify a type of the appliance according to a voltage/current signature data of the appliance when the appliance is connected with the one of the test loads or when the appliance receives the one of the test signals.

4. The electronic device of claim 3, further comprising:
  a voltage/current detecting module electrically connected with the programmable load and signal module and the processing module, and configured to detect a voltage/current value of the appliance when the appliance is connected with the one of the test loads or when the appliance receives the one of the test signals,
  wherein the processing module generates the voltage/current signature data according to the voltage/current value.

5. The electronic device of claim 4, wherein the processing module comprises:
  a signature detecting unit configured to generate the voltage/current signature data according to the voltage/current value;
  a signature extracting unit configured to compare the voltage/current signature data with a plurality of signature data so as to generate a comparison result data; and
  a control unit configured to identify the type of the appliance according to the comparison result data.

6. The electronic device of claim 5, wherein the processing module further comprises:
  a test management unit configured to search one of a plurality of test load data or one of a plurality of test signal data in a test database according to the comparison result data, and configured to provide the one of the test load data or the one of the test signal data to the programmable load and signal module,
  wherein the programmable load and signal module provides the one of the test loads to connect with the appliance according to the one of the test load data or provides the one of the test signals to the appliance according to the one of the test signal data.

7. The electronic device of claim 5, further comprising:
  a signature database configured to store the signature data of a plurality of different types of appliances when the different types of appliances are connected with the test loads and when the different types of appliances receive the test signals.

8. The electronic device of claim 5, wherein the signature detecting unit is further configured to compare the voltage/current value with a threshold value, wherein the signature detecting unit generates the voltage/current signature data according to the voltage/current value when the voltage/current value conforms to the threshold value.

9. The electronic device of claim 3, wherein the test loads comprises a plurality of RLC (resistor-inductor-capacitor) loads, a variable RLC load, a transformer, a filter and a regulator.

10. The electronic device of claim 3, wherein the test signals comprise a harmonic, a power line communication signal and an infrared signal.

* * * * *